United States Patent [19]

Ishikawa et al.

[11] Patent Number: 5,132,651
[45] Date of Patent: Jul. 21, 1992

[54] FILTER APPARATUS

[75] Inventors: Youhei Ishikawa; Jun Hattori; Toshio Nishikawa, all of Nagaokakyo, Japan

[73] Assignee: Murata Manufacturing Co., Ltd., Japan

[21] Appl. No.: 536,175

[22] Filed: Jun. 11, 1990

[30] Foreign Application Priority Data

Jun. 13, 1989 [JP] Japan .................................. 1-150998
Aug. 25, 1989 [JP] Japan .................................. 1-219882

[51] Int. Cl.$^5$ ........................ H01P 1/20; H03H 11/00
[52] U.S. Cl. ............................... 333/202; 333/206; 333/134
[58] Field of Search ................. 333/1.1, 100, 126, 129, 333/132, 134, 174–176, 202–204, 206, 217, 168; 455/286, 307

[56] References Cited

U.S. PATENT DOCUMENTS

| | | | |
|---|---|---|---|
| 2,297,451 | 9/1942 | Beudel et al. | 333/176 X |
| 2,994,844 | 8/1961 | Niederman | 333/185 |
| 3,287,667 | 11/1966 | Boutelant | 333/202 X |
| 4,159,454 | 6/1979 | Willmore | 333/202 X |
| 4,292,607 | 9/1981 | Goldie et al. | 333/1.1 X |
| 4,538,123 | 8/1985 | Mariani et al. | 333/208 |
| 4,553,264 | 11/1985 | Hasegawa et al. | 333/206 X |
| 4,816,788 | 3/1989 | Ishikawa et al. | 333/202 X |
| 4,823,098 | 4/1989 | DeMuro et al. | 333/202 X |
| 4,910,481 | 3/1990 | Sasaki et al. | 333/134 |

FOREIGN PATENT DOCUMENTS

| | | | |
|---|---|---|---|
| 0110801 | 5/1988 | Japan | 333/202 |
| 0142701 | 6/1988 | Japan | 333/202 |
| 0157501 | 6/1988 | Japan | 333/175 |
| 0157502 | 6/1988 | Japan | 333/175 |

OTHER PUBLICATIONS

Patent Abstracts of Japan, JP-A-62 039 902, Feb. 20, 1987.
Patent Abstracts of Japan, JP-A-63 142 701, Jun. 15, 1988.
Patent Abstracts of Japan, JP-A-63 010 801, Jan. 18, 1988.
Patent Abstracts of Japan, JP-A-63 157,501, Jun. 30, 1988.

Primary Examiner—Robert J. Pascal
Assistant Examiner—Seung Ham
Attorney, Agent, or Firm—Ostrolenk, Faber, Gerb & Soffen

[57] ABSTRACT

A filter apparatus in accordance with the present invention comprises, for example, a band-pass filter and a plurality of band-stop filters connected as the post-stage to the band-pass filter. The band-pass filter transmits a band containing a desired frequency band, and the band-stop filters attenuate undesirable frequency bands. Another filter apparatus in accordance with the present invention comprises, for example, a first band-pass filter, a circulator connected to the first band-pass filter, and second band-pass filters connected to the circulator. The first band-pass filter transmits a band containing a desired frequency band to the circulator, and the second band-pass filters transmit undesirable frequency bands and reflect the desire frequency band to the circulator. The desired frequency band is outputted from this circulator. Still another filter apparatus in accordance with the present invention comprises, for example, a circulator and a band-pass filter connected to the circulator. The band-pass filter transmits an undesirable frequency band and reflects a desired frequency band to the circulator. The desired frequency band is outputted from this circulator.

6 Claims, 10 Drawing Sheets

F I G. 2A
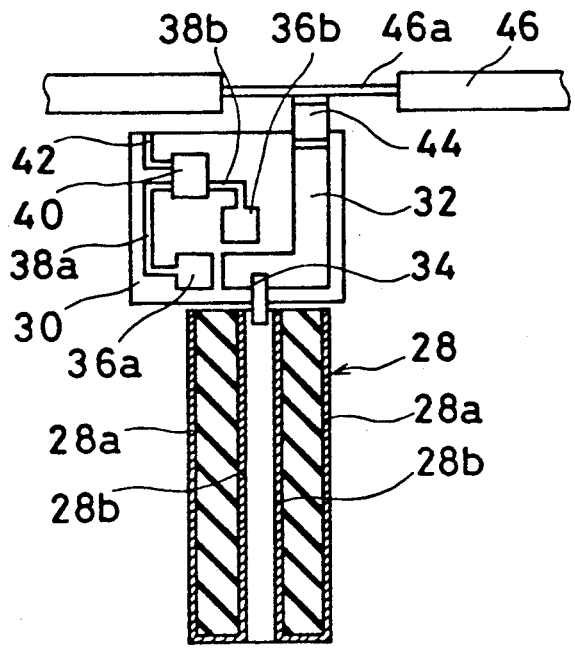
F I G. 2B
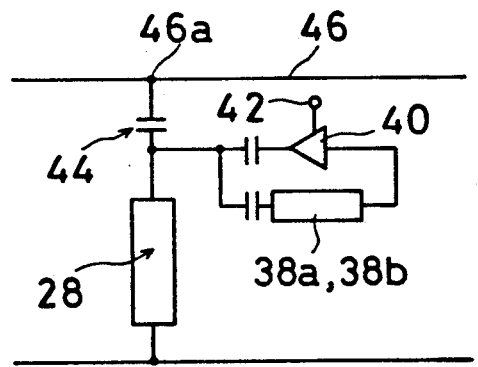
F I G. 3
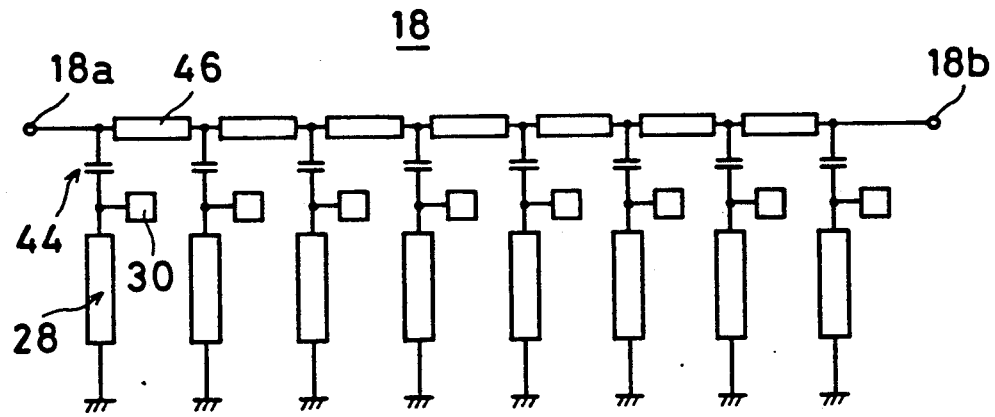

FILTER APPARATUS

BACKGROUND OF THE INVENTION

1. Field of the Invention

The present invention relates to a filter apparatus, and specifically, for example, relates to a filter apparatus for use in a cellular telephone of and other radio equipment.

2. Description of the Prior Art

In recent years, in the United States, following a rapid propagation and expansion of cellular car telephones and a rapid increase in the number of cellular base stations, extension of the width of frequency bands to be used has been studied to increase the number of channels to be used, and assignments of frequency bands to be used have been announced. In this situation, the frequency to be used in a service system sometimes approaches the frequency to be used in another service system, and therefore, to prevent mutual interference between those service systems, for example, a filter apparatus having a sharp characteristic as shown in FIG. 14 and a filter apparatus having a sharp characteristic as shown in FIG. 15 are requested.

To obtain such a sharp characteristic, it has been considered to configure a filter apparatus using a cavity resonator, but this apparatus becomes large in shape, going against the request for miniaturization.

Also, conventionally, in a filter apparatus using resonators, to obtain such a sharp characteristic, the value of Q is required to be increased by coupling each active circuit to each resonator respectively, resulting in a complicated structure.

Furthermore, in the conventional filter using resonators, a load is connected to the output end thereof, and therefore the value of $Q_0$ of the resonator has to be made considerably large taking the effect of the load into account. In such a case, an active circuit coupled to the resonator has to be operated in an unstable state, and thereby the apparatus lacks practical usability.

SUMMARY OF THE INVENTION

Therefore, a principal object of the present invention is to provide a filter apparatus which is small in size and has a sharp characteristic.

Also, another object of the present invention is to provide a filter apparatus which can obtain a sharp characteristic by a simple structure.

A first filter apparatus for solving the principal object of the present invention is a filter apparatus wherein a desired frequency band is located in a pass band thereof and undesirable frequency bands are located in attenuation bands thereof, and comprises an input terminal, a band-pass filter an input end of which is connected to the input terminal and which is for transmitting a band containing the above-mentioned pass band, a plurality of band-stop filters which are connected in series as the post-stage to this band-pass filter and are for attenuating the above-mentioned attenuation bands, and an output terminal connected as the post-stage to a plurality of the band-stop filters, and the band-stop filter comprises a resonator and an active circuit which is coupled to the resonator and becomes a negative resistance in an operation band of the band-stop filter.

In this first filter apparatus, the band-pass filter transmits a signal of the band containing the desired frequency band. Then, a plurality of the band-stop filters attenuate signals of the undesirable frequency bands. In this case, the active circuit coupled to the resonator in the band-stop filter becomes a negative resistance, and therefore the value of Q of the band-stop filter becomes large. For this reason, the plurality of the band-stop filters sharply attenuate the signals of the undesirable frequency bands.

A second filter apparatus for solving the principal object of the present invention is a filter apparatus wherein a desired frequency band is located in a pass band thereof and undesirable frequency bands are located in attenuation bands thereof, and comprises an input terminal, a first band-pass filter an input end of which is connected to the input terminal and which is for transmitting a band containing the above-mentioned pass band, a non-reversible circuit element a first terminal of which is connected to an output end of the first band-pass filter, a plurality of second band-pass filters input ends of which are connected in common to a second terminal of the non-reversible circuit element which becomes the output side when the first terminal is the input side and pass bands of which are located in the abovementioned attenuation bands, and an output terminal which is connected to a third terminal of the non-reversible circuit element which becomes the output side when the abovementioned second terminal is the input side, and the second band-pass filter comprises a resonator and an active circuit which is coupled to the resonator and becomes a negative resistance in an operation band of the second band-pass filter.

In this second filter apparatus, the first band-pass filter transmits a signal of the band containing the desired frequency band, and the non-reversible circuit element gives the signal to a plurality of the second band-pass filters. The second band-pass filters transmit signals of the undesirable frequency bands, and reflect the signal of the desired frequency band of the non-reversible circuit element. In this case, the active circuit coupled to the resonator in the second band-pass filter becomes a negative resistance, and therefore the value of Q of the second band-pass filter becomes large. For this reason, a plurality of the second band-pass filters sharply transmit the undesirable frequency bands, and sharply reflect the desired frequency band. Then, the non-reversible circuit element gives the reflected desired frequency band to the output terminal.

A third filter apparatus for solving another object of the present invention is a filter apparatus wherein a desired frequency band is located in an attenuation band thereof, and comprises an input terminal, a non-reversible circuit element a first terminal of which is connected to the input terminal, a band-pass filter which has a resonator an input end of which is connected to a second terminal of the non-reversible circuit element which becomes the output side when the first terminal is the input side and a pass band thereof is located in the above-mentioned attenuation band, and an output terminal which is connected to a third terminal of the non-reversible circuit element which becomes the output side when the above-mentioned second terminal is the input side.

In this third filter apparatus, when a signal is inputted to the input terminal, the non-reversible circuit element gives the signal to the band-pass filter. The band-pass filter transmits a signal of the attenuation band, and reflects signals of the bands other than the attenuation band to the non-reversible circuit element. In this case, the value of Q of the band-pass filter becomes large by coupling the active circuit becoming a negative resistance in the operation band of this band-pass filter to any one of the resonators thereof, and the band-pass filter sharply transmits the attenuation band, and sharply reflects the bands other than the attenuation band. Then, the non-reversible circuit element gives the signals of the reflected bands to the output terminal.

In accordance with the present invention, a filter apparatus having a sharp characteristic can be obtained. Moreover, this filter apparatus uses the resonator in place of the cavity resonator, therefore being small in size.

Also, in accordance with the present invention, a filter apparatus is containable which can obtain a sharp characteristic by a simple structure that the active circuit is coupled to any one of the resonators of the band-pass filter. Furthermore, in this filter apparatus, no load is required to be connected to the output end of the band-pass filter, and therefore the value of $Q_0$ of the resonator in the band-pass filter is not required to be so large, and the active circuit coupled to the resonator of the band-pass filter can be operated in stable state, and thereby the apparatus excels in practical usability.

The above and other objects, features, aspects and advantages of the present invention will become more apparent from the following detailed description of the disclosed embodiments of the present invention when taken in conjunction with accompanying drawings.

BRIEF DESCRIPTION OF THE DRAWINGS

FIG. 2A is an illustration view showing a major part of a band-stop filter used for the embodiment of FIG. 1, and FIG. 2B is an equivalent circuit diagram of the major part of the same.

FIG. 3 is an equivalent circuit diagram of the band-stop filter used for the embodiment of FIG. 1.

DESCRIPTION OF THE PREFERRED EMBODIMENTS

Figure 1:
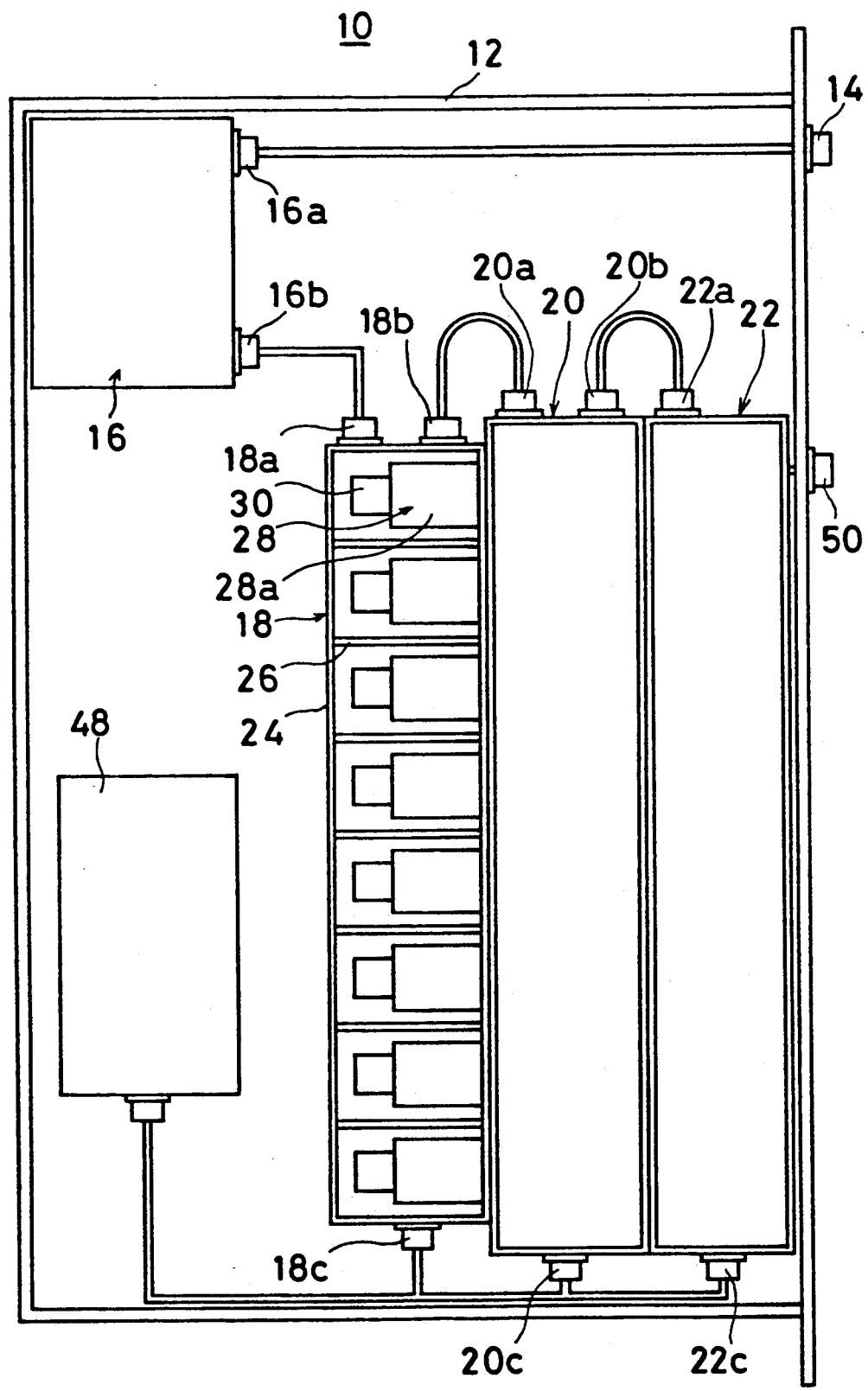
FIG. 1 is an illustration view showing an embodiment of the present invention.

FIG. 1 is an illustration view showing an embodiment of the present invention. This filter apparatus 10 comprises, for example, a box-shaped case 12 composed of metal. For example, a coaxial connector 14 is fixed to one side wall of this case 12 as an input terminal in a manner of penetrating therethrough.

Also, a first band-pass filter 16 comprising, for example, dielectric coaxial resonators is housed in this case 12. This band-pass filter 16 has a pass band in a band (about 820–853 MHz in this embodiment) containing desired frequency bands (a band of 835–845 MHz and a band of 846.5 –849 MHz in this embodiment). Accordingly, this band-pass filter 16 transmits a signal of the band containing the desired frequency bands. An input end 16a of this band-pass filter 16 is connected to the coaxial connector 14 as an input terminal, for example, by a coaxial cable.

Furthermore, for example, three band-stop filters 18, 20 and 22 are housed in the case 12. These band-stop filters 18, 20 and 22 are for attenuating undesirable frequency bands, that is, a band of 845–846.5 MHz, a band of 849 MHz and higher, and a band of 835 MHz and lower among bands transmitted by the band-pass filter 16 respectively, and are connected in series as the post-stage to the band-pass filter 16. This means that an output end 16b of the band-pass filter 16 is connected to an input end 18a of the first-stage band-stop filter 18, an output end 18b of the first-stage band-stop filter 18 is connected to an input end 20a of the intermediate-stage band-stop filter 20, and an output end 20b of the intermediate-stage band-stop filer 20 is connected to an input end 22a of the last-stage band-stop filter 22 respectively, for example, by coaxial cables.

These band-stop filters 18, 20 and 22 differ in the number of stages of the dielectric coaxial resonator to be used and the band to be attenuated, but have structures similar to one another, and therefore a detailed description will be made particularly of on the first-stage band-stop filter 18.

This first-stage band-stop filter 18 comprises, for example, a cuboid-shaped case 24 composed of metal, and, for example, space in this case 24 is divided into eight housing parts by seven partition plates 26 composed of metal. Then, in each housing part, a dielectric coaxial resonator 28 of, for example, $\lambda/4$ and a substrate 30 composed of an insulating material, for example, epoxy resin are housed. In this case, an outer conductor 28a as one end of each dielectric coaxial resonator 28 is grounded to the case 24. Also, each substrate 30 is disposed at the open end side of each dielectric coaxial resonator 28.

As shown in FIG. 2A, on this substrate 30, for example, an L-shaped conductor pattern 32 is formed, and to one end of this conductor pattern 32, an inner conductor 28b as the other end of the dielectric coaxial resonator 28 is connected, for example, by a conductor ribbon 34. Furthermore, on the substrate 30, two electrodes 36a and 36b are installed which produce gap capacities in cooperation with the conductor pattern 32. To these electrodes 36a and 36b, an amplifier circuit 40, namely an active circuit which is configured, for example, with a Si bipolar transistor and so on is connected by lines 38a and 38b for phase adjustment. Accordingly, this amplifier circuit 40 is coupled to the dielectric coaxial resonator 28. Also, this amplifier circuit 40 is so configured as to become a negative resistance in an operation band of the band-stop filter 18. For this reason, the apparent value of Q of this band-stop filter 18 becomes large in the operation band of the band-stop filter 18. Furthermore, on the substrate 30, a conductor pattern 42 for supplying power to this amplifier circuit 40 is formed.

On the other hand, to the other end of the abovedescribed conductor pattern 32, for example, one end of a chip-shaped capacitor 44 is soldered, and the other end of the capacitor 44 is soldered to a center conductor 46a of a coaxial cable 46 as a transmission line. Accordingly, an equivalent circuit of the dielectric coaxial resonator 28 and surrounding components is formed as shown in FIG. 2B. The dielectric coaxial resonator 28 and capacitor 44 are selected in the band of 845–846.5 MHz to be attenuated.

Figure 4:
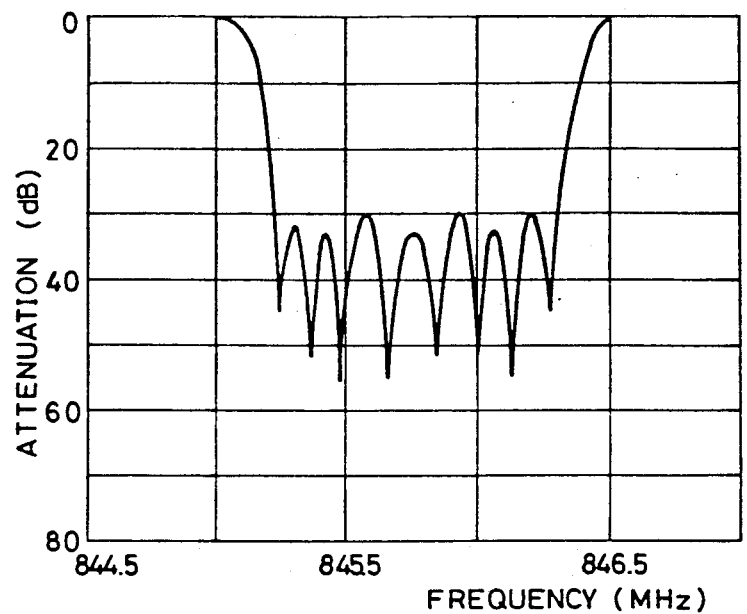
FIG. 4 is a graph showing a frequency characteristic of the band-stop filter as shown in FIG. 3.

Then, in this band-stop filter 18, the eight stages each comprising the dielectric coaxial resonator 28, the amplifier circuit 40 and the like are connected by the above-described coaxial cable 46. Furthermore, the ends of that coaxial cable 46 are connected to the input end 18a and the output end 18b which penetrate through one side wall of the case 24, respectively. Accordingly, an equivalent circuit of this band-stop filter 18 is formed as shown in FIG. 3. Also, this band-stop filter 18 has a frequency characteristic as shown in FIG. 4.

In addition, though not illustrated, the conductor pattern 42 of each substrate 30 is connected to a power source end 18c penetrating through the other side wall of the case 24. Then, to this power source end 18c, a DC power source 48 in the case 12 is connected, and power is supplied from the DC power source 48.

The intermediate-stage band-stop filter 20 has a structure similar to the above-described band-stop filter 18, but differs therefrom in that it has 10-stages each having a dielectric coaxial resonator and the like and in that the attenuation band is the band of 849 MHz and higher.

Also, the last-stage band-stop filter 22 differs from the above-described band-stop filter 18 in that it has 18 stages each having a dielectric coaxial resonator and the like and in that the attenuation band is the band of 835 MHz and lower.

Power is supplied from the DC power source 48 also to power source ends 20c and 22c of these band-stop filters 20 and 22.

Furthermore, the output end of the last-stage band-stop filter 22 is connected to a coaxial connector 50 as an output end penetrating through the side wall of the case 12.

Figure 5:
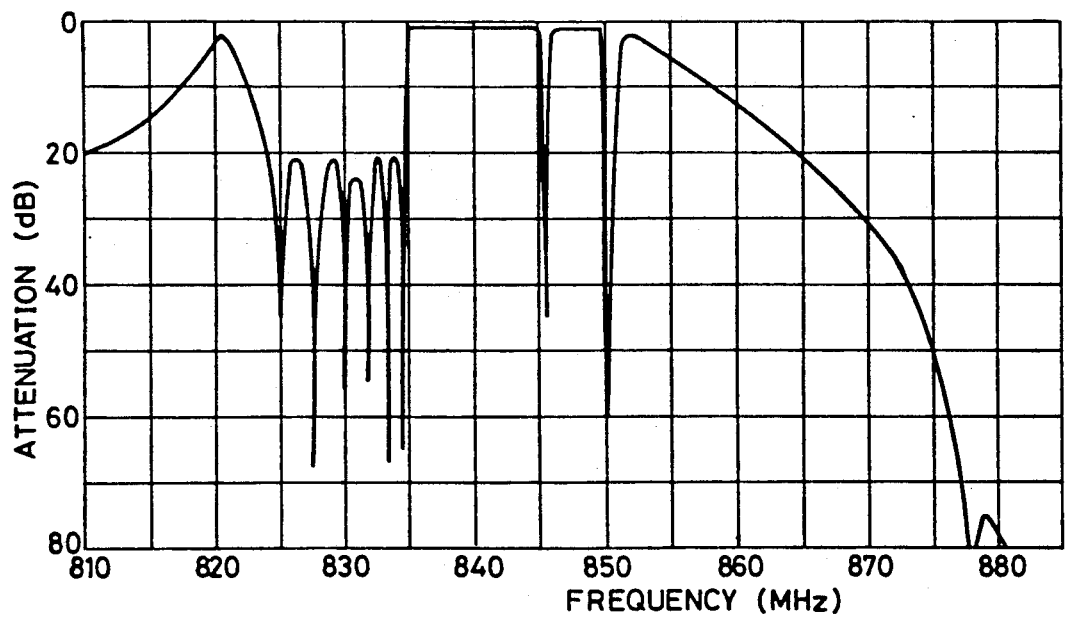
FIG. 5 is a graph showing a frequency characteristic of the embodiment of FIG. 1.

In this filter apparatus 10, the band-pass filter 16 transmits a signal of the band containing the desired frequency bands, and the post-stage band-stop filters 18, 20 and 22 sharply attenuate signals of the undesirable frequency bands among signals transmitted by the band-pass filter 16, that is, signals of the band of 845–846.5 MHz, the band of 849 MHz and higher and the band of 835 MHz and lower, respectively. Accordingly, this filter apparatus 10 has a frequency characteristic as shown in FIG. 5.

Figure 6A:
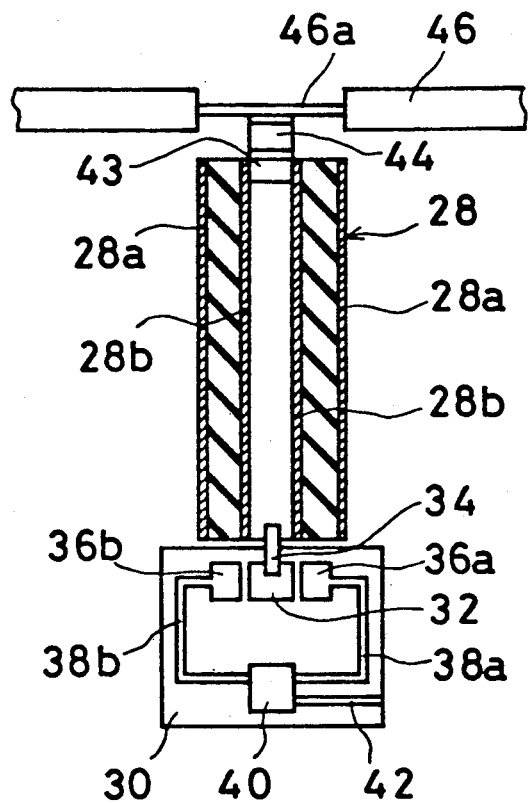
FIG. 6A is an illustration view showing a major part of another example of the band-stop filter used for the embodiment of FIG. 1.
Figure 6B:
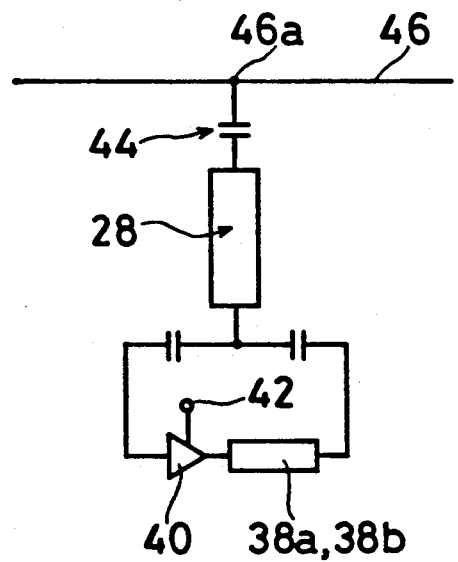
FIG. 6B is an equivalent circuit diagram of the major part thereof.

In addition, in the above-described embodiment, dielectric coaxial resonators of λ/4 are used in the band-stop filter, but dielectric coaxial resonator of λ/2 may be used in place of λ/4. In this case, for example, as shown in FIG. 6A and FIG. 6B, one end side of the inner conductor 28b of the dielectric coaxial resonator 28 of λ/2 is coupled to the amplifier 40 as an active circuit, and further, for example, a metal cylindrical body 43 is fixed to the other end side of the inner conductor 28b with a conductive adhesive, and the both ends of the capacitor 44 are soldered to the metal cylindrical body 43 and the coaxial cable 46 as a transmission line. Or, for the resonator used in the band-stop filter, a resonator having another structure such as a strip-line resonator may be used, without being limited to the dielectric coaxial resonator, and the resonator mode thereof may be a mode such as the TE mode or the TM mode.

Figure 7:
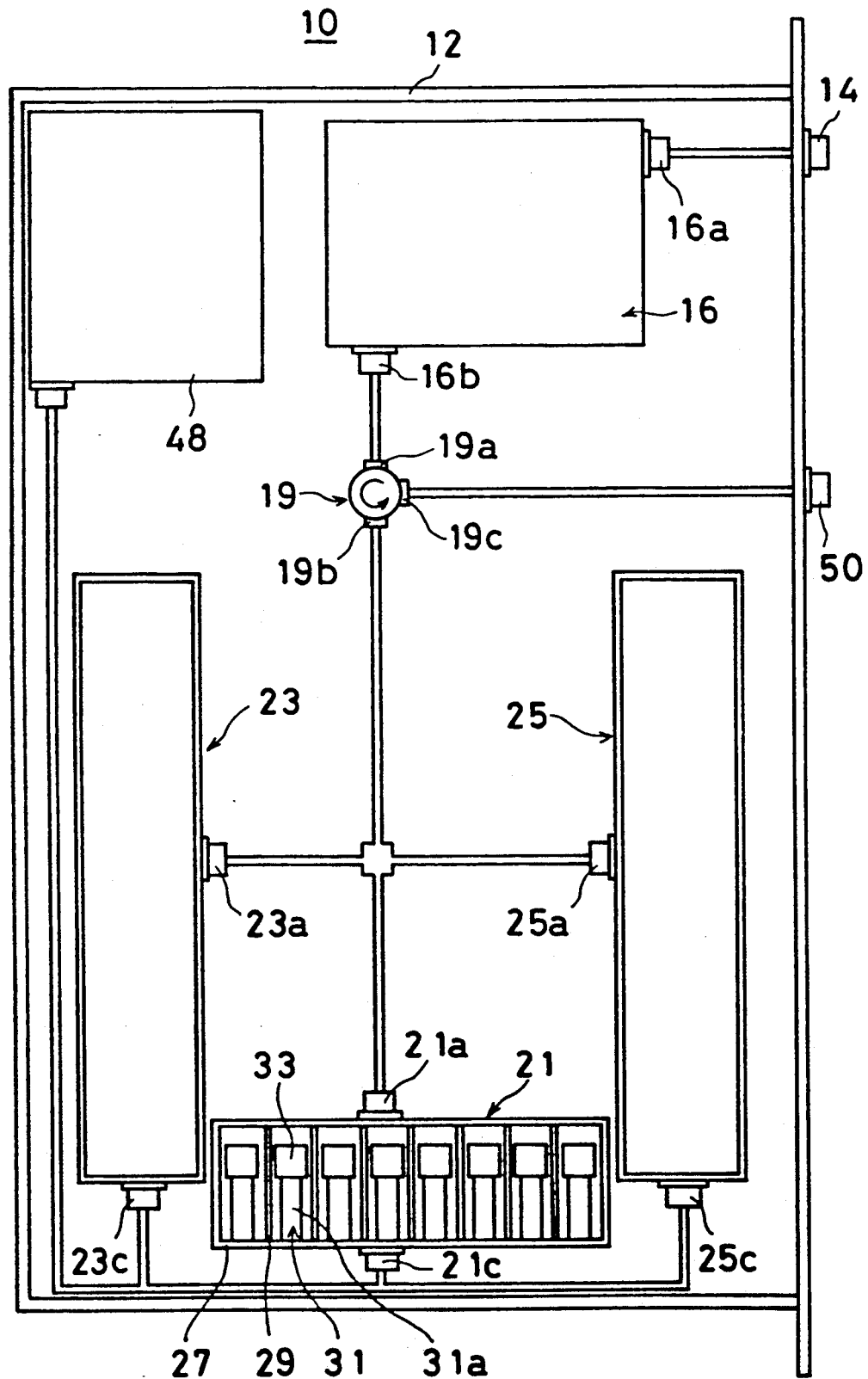
FIG. 7 is illustration view showing another embodiment of the present invention.

FIG. 7 is an illustration view showing another embodiment of the present invention. This embodiment differs from the embodiment as shown in FIG. 1 particularly in the construction of the post-stage following the first band-pass filter 16.

This means that in this embodiment, the output end 16b of the first band-pass filter 16 is connected to a first terminal 19a of a circulator 19 which may be referred to more broadly as a non-reversible circuit element.

Furthermore, input ends 21a, 23a and 25a of three second band-pass filters 21, 23 and 25 are connected in common to a second terminal 19b which becomes the output side of the circulator 19 when the terminal 19a of this circulator 19 is the input side.

These second band-pass filters 21, 23 and 25 have pass bands in bands to be attenuated among bands transmitted by the band-pass filter 16, for example, a band of 845–846.5 MHz, a band of 849 MHz and higher and a band of 835 MHz and lower, respectively. These second band-pass filters 21, 23 and 25 differ in the number of stages of the dielectric coaxial resonator to be used or the like and the pass band, but have structures similar to one another, and therefore a detailed description will be made particularly of one of the second band-pass filters 21.

Like the band-stop filter 18 in the embodiment as shown in FIG. 1, this second band-pass filter 21 comprises eight sets of a dielectric coaxial resonator 31 of λ/4 whose outer conductor 31a is grounded and a substrate 33 having an amplifier circuit 45 as an active circuit which is coupled to the dielectric coaxial resonator 31.

This means that this second band-pass filter 21 comprises, for example, a cuboid-shaped case 27 composed of metal, and space in this case 27 is divided into eight housing parts by seven partition plates 29 composed of metal. Then, in each of these housing parts, for example, the dielectric coaxial resonator 31 of λ/4 and the substrate 33 composed of an insulating material such as epoxy resin are housed. In this case, the outer conductor 31a as one end of each dielectric coaxial resonator 31 is grounded to the case 27. Also, each substrate 33 is disposed at the open end side of the dielectric coaxial resonator 31.

Figure 8A:
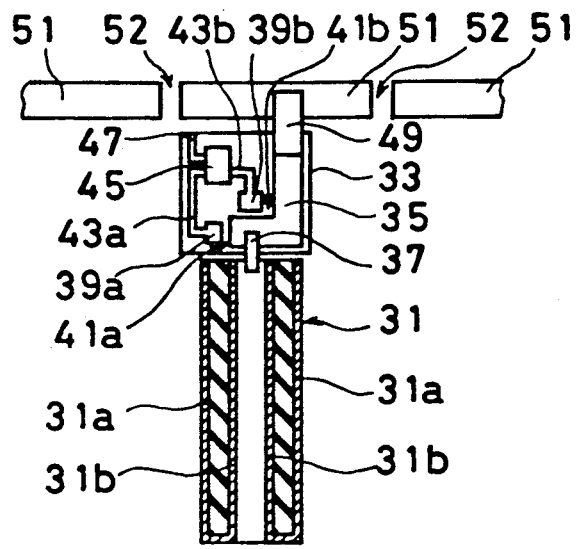
FIG. 8A is an illustration view showing a major part of a second band-pass filter used for the embodiment of FIG. 7.

As shown in FIG. 8A, on this substrate 33, for example, an L-shaped conductor pattern 35 is formed, and to one end of this conductor pattern 35, an inner conductor 31b as the other end of the dielectric coaxial resonator 31 is connected, for example, by a conductor ribbon 37. Furthermore, on the substrate 33, two electrodes 39a and 39b are formed in the vicinity of one end of the conductor pattern 35, and these electrodes 39a and 39b are coupled to the conductor pattern 35 respectively through gap capacities produced by gaps 41a and 41b. Also, connected to these electrodes 39a and 39b, the amplifier circuit 45 provides an active circuit which is configured, for example, with a Si bipolar transistor, the connection being by lines 43a and 43b for phase adjustment. Accordingly, this amplifier circuit 45 is coupled to the dielectric coaxial resonator 31. Also, this amplifier circuit 45 is configured so as to become a negative resistance in the operation band of the second band-pass filter 21. For this reason, the apparent value of Q of the second band-pass filter 21 becomes large in the operation band of the second band-pass filter 21. Furthermore, on the substrate 33, a conductor pattern 47 for supplying power to this amplifier circuit 45 is formed.

Figure 8B:
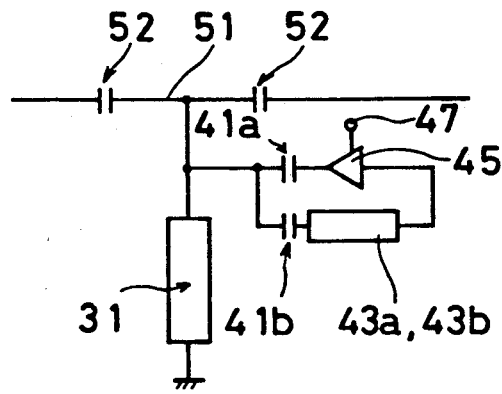
FIG. 8B is an equivalent circuit diagram of the major part of the same.

Furthermore, the other end of the conductor pattern 35 on each substrate 33 is connected to a respective electrode 51 of a transmission line, by a conductor ribbon 49. Also, these electrodes 51 are disposed in a line with intervals kept between them so that gap capacities are produced by gaps 52 between them. Accordingly, an equivalent circuit of this dielectric coaxial resonator 31 and the surrounding components is formed as shown in FIG. 8B.

Figure 9:
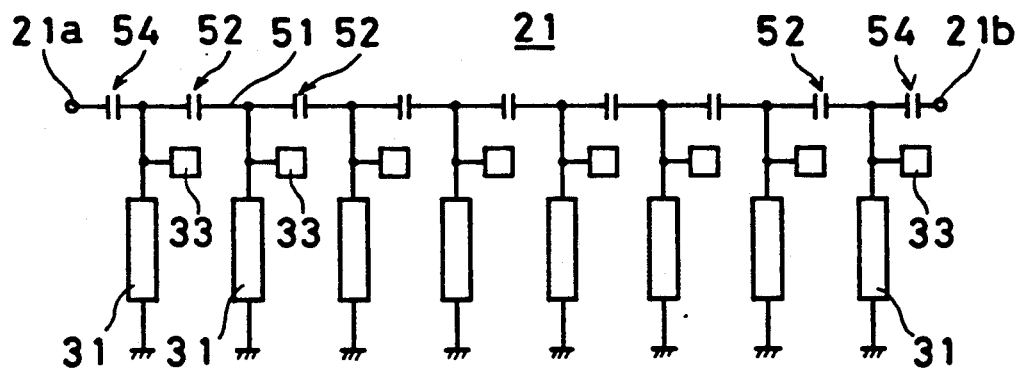
FIG. 9 is an equivalent circuit diagram of the second band-pass filter used for the embodiment of FIG. 7.

Furthermore, the electrodes 51 at the both ends are coupled to the input end 21a and the output 21b, for example, through gap capacities produces by gaps 54. Accordingly, this second band-pass filter 21 is expressed by an equivalent circuit as shown in FIG. 9. The output end 21b of this second band-pass filter 21 is put in no-load state in this embodiment. In addition, to the output end 21b of this second band-pass filter 21, a resistive load, for example, may be connected.

Figure 10:
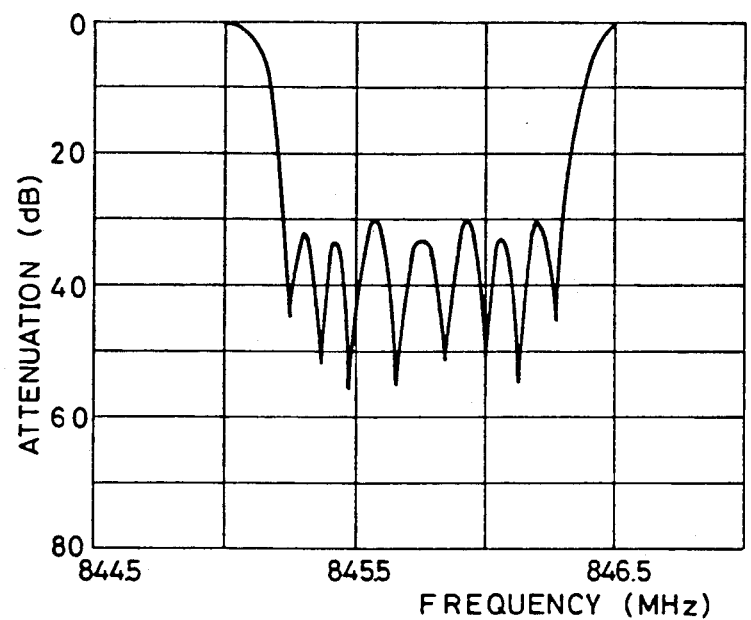
FIG. 10 is a graph showing a frequency characteristic of reflection at the input end side of the second band-pass filter as shown in FIG. 9.

Also, the dielectric coaxial resonator 31 and the gap capacities such as those between the electrodes 51 in the second band-pass filter 21 are selected so that the resonance frequencies thereof are located in the band of 845-846.5 MHz to be attenuated. Accordingly, for this second band-pass filter 21, the frequency characteristic of reflection at the input end 21a side becomes as shown in FIG. 10.

In addition, though not illustrated, the conductor pattern 47 of each substrate 33 is connected to a power source end 21c penetrating through the side wall of the case 27. Then, to this power source end 21c, the DC power source 48 in the case 12 is connected, and power is supplied from the DC power source 48.

Another second band-pass filter 23 has a structure similar to the above-described band-pass filter 21, but differs therefrom in that this has ten dielectric coaxial resonator stages and the like and the pass band is the band of 849 MHz and higher.

Still another second band-pass filter 25 differs from the above-described band-pass filter 21 in that this has dielectric coaxial resonator stages and the like, and the pass band is the band of 835 MHz and lower.

For these second band-pass filters 23 and 25, the output ends thereof are also put in no-load state, and power is supplied from the DC power source 48 also to power source ends 23c and 25c of these second band-pass filters 23 and 25. In addition, loads, for example, resistances, may be connected also to the output ends of these second band-pass filters 23 and 25.

In addition, the amplifier circuit in each second band-pass filter is configured so as to become a negative resistance in the operation band of the second band-pass filter.

A third terminal 19c of the circulator 19, which becomes the output side when the second terminal 19b of the circulator 19 is the input side, is connected to the coaxial connector 50 as the output terminal penetrating through the side wall of the case 12.

In this filter apparatus 10, the first band-pass filter 16 transmits a signal of the band containing the desired frequency bands to the first end 19a of the circulator 19. Then, this circulator 19 gives the signal to the input ends 21a, 23a and 25a of three second band-pass filters 21, 23 and 25.

Figure 11:
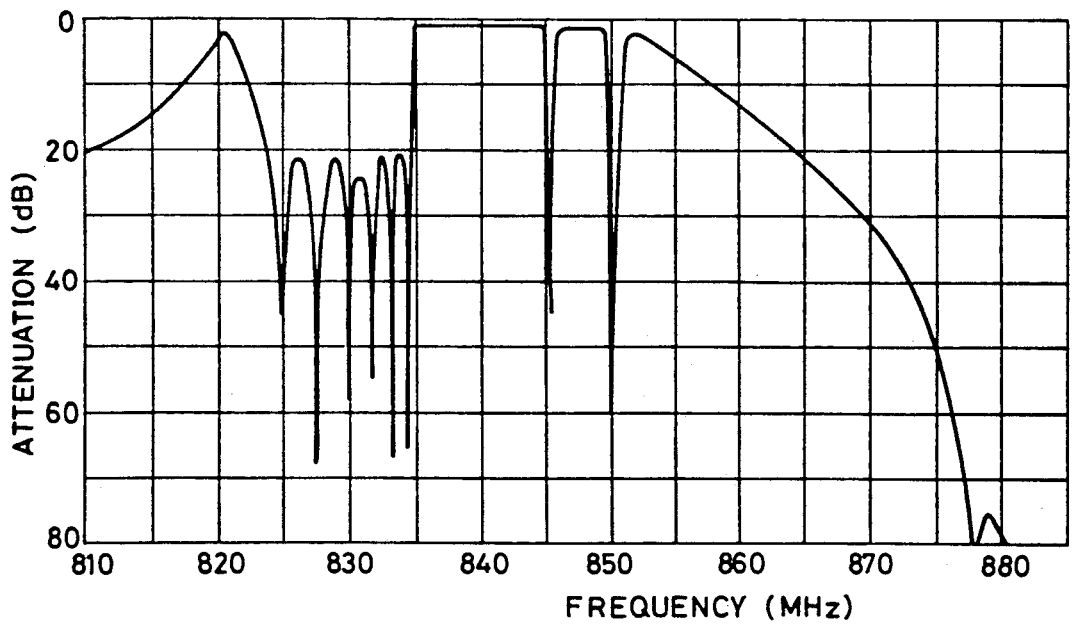
FIG. 11 is a graph showing a frequency characteristic of the embodiment of FIG. 7.

One second band-pass filter 21 has the pass band in the frequency band of 845-846.5 MHz to be attenuated, and band, giving them to the second terminal 19b of the circulator 19. Similarly, the other second band-pass filter 23 sharply reflects signals of bands other than the band of 849 MHz and higher, and gives them to the second terminal 19b of the circulator 19, and the still other second band-pass filter 25 sharply reflects signals of bands other than the band of 835 MHz and lower, giving them to the second terminal 19b of the circulator 19. Accordingly, the signal of the desired frequency bands is given to the second terminal 19b of the circulator 19. For this reason, the signal of the desired frequency bands is outputted from the third terminal 19c of the circulator 19, and the signal is given to the coaxial connector 50 as the output terminal. Accordingly, in this filter apparatus 10, a frequency characteristic as shown in FIG. 11 is obtained.

Figure 16:
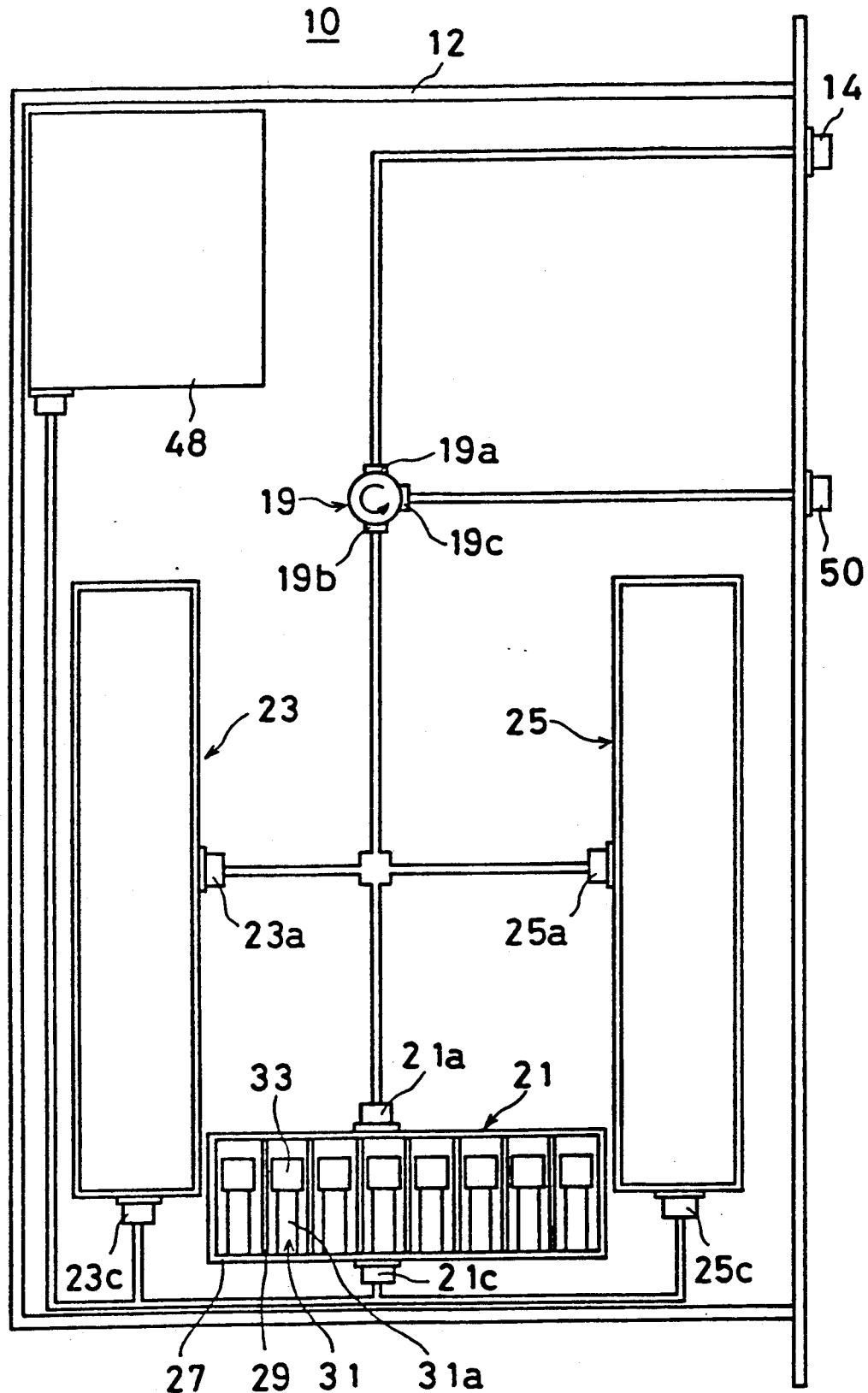
FIG. 16 is an illustration view showing a further embodiment of the invention.

In the embodiment as shown in FIG. 7, the first band-pass filter 16 is installed as the pre-stage of the circulator 19, as shown in FIG. 16, it is also possible for no filter to be installed as the pre-stage of the circulator 19. In this case, the first terminal 19a of the circulator 19 is connected directly to the coaxial connector 14 as the input terminal.

Figure 12:
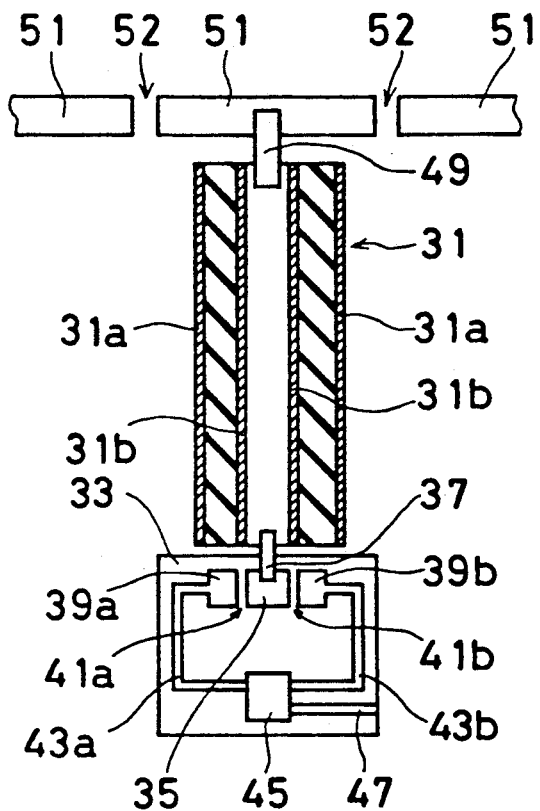
FIG. 12 is an illustration view showing a major part of another example of the second band-pass filter used for the embodiment of FIG. 7.
Figure 13:
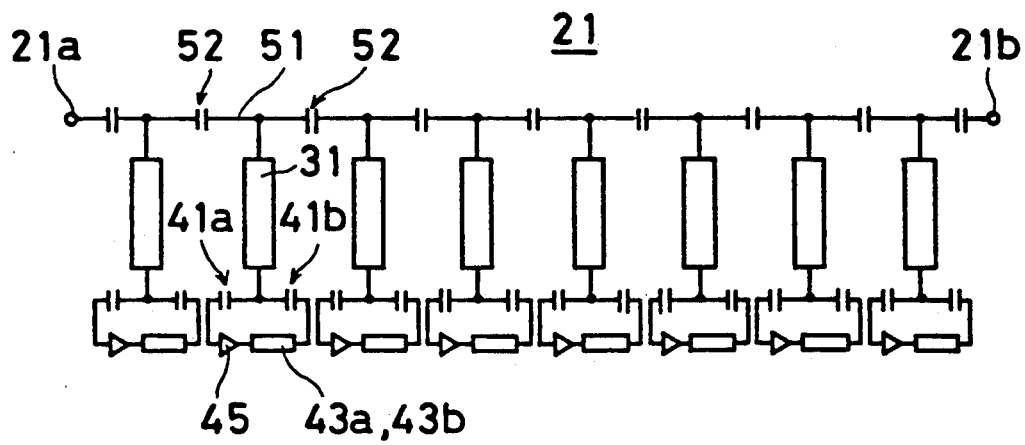
FIG. 13 is an equivalent circuit diagram of the second band-pass filter as shown in FIG. 12.
Figure 14:
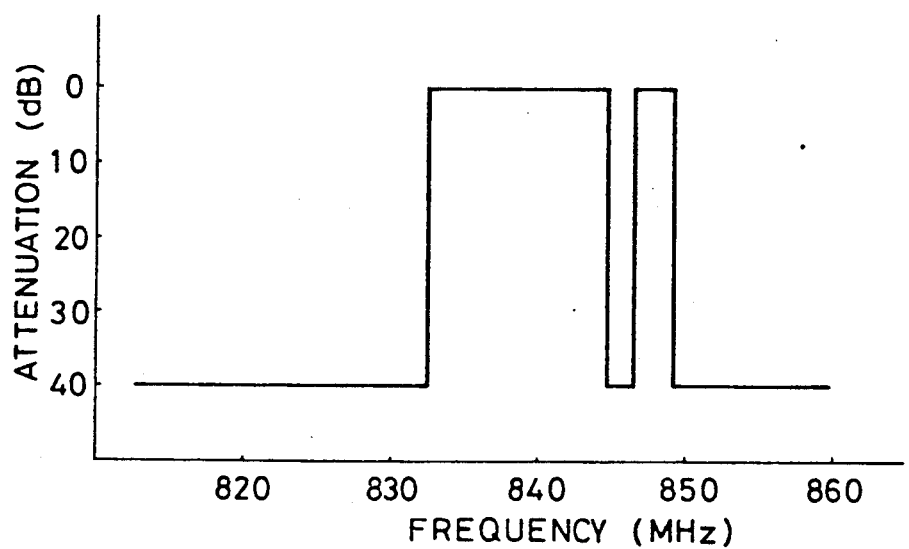
FIG. 14 and FIG. 15 are graphs showing frequency characteristics which are the background of the present invention and are required for it.
Figure 15:
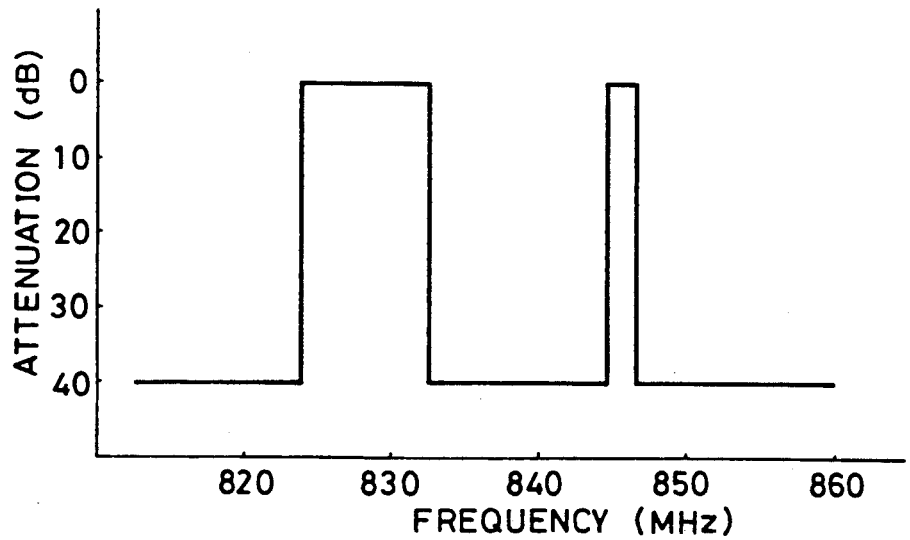

Also, in the embodiment as shown in FIG. 7, dielectric coaxial resonators of λ/4 are used in the second band-pass filter, but dielectric coaxial resonators of λ/2 may be used in place of λ/4. In this case, as shown in FIG. 12 and FIG. 13, one end side of the inner conductor 31b of the dielectric coaxial resonator 31 of λ/2 is coupled to the amplifier circuit 45 as an active circuit, and the other end side thereof is connected to the electrode 50 as a transmission line. Or, for the resonator used in the second band-pass filter, a resonator having another structure such as the strip-line resonator may be used without being limited to the dielectric coaxial resonator, and the resonance mode thereof may be a mode such as the TE mode or the TM mode.

Furthermore, the embodiment as shown in FIG. 7 has a characteristic of attenuating a plurality of bands, but the present invention is applicable also to a filter apparatus having a characteristic of attenuating one band. In this case, for example, in the embodiment as shown in FIG. 7, only the input end of one second band-pass filter having the pass band in the band to be attenuated has to be connected to the second terminal 19b of the circulator 19.

Also, it is possible for an active circuit to be coupled to only one of the resonators. In this case, the active circuit is desirably coupled only to the pre-stage or post-stage resonator, and in view of noise generated on the circulator side from the second band-pass filter, it is most desirable to couple the active circuit to the post-stage resonator.

In addition, each of the embodiments as shown in FIG. 1 and FIG. 7 has a characteristic of transmitting two different bands, but in the present invention, a filter apparatus having a characteristic of transmitting three or more different bands may be configured. In this case, for example, in the embodiment as shown in FIG. 1, three or more band-stop filters having attenuation bands differing from one another have only to be installed in the post-stage of the band-pass filter, or, in the embodiment as shown in FIG. 7, three or more second band-pass filters having pass bands differing from one another have only to be connected to the circulator.

Although embodiments of the present invention have been described and illustrated in detail, it is clearly understood that the same is by way of illustration and example only and is not to be taken by way of limitation, the spirit and scope of the present invention being limited only by the terms of the appended claims.

What is claimed is:

1. A filter apparatus wherein a desired frequency band is located in a pass band thereof and undesirable frequency bands are located in attenuation bands thereof, comprising
    a case,
    an input terminal fixed to one side wall of said case,
    a band-pass filter in said case, an input end of which is connected to said input terminal, and which is for transmitting a band containing said pass band,
    a plurality of band-stop filters in said case which are connected in series as the post-stage to said band-pass filter, and are for attenuating said attenuation bands, and
    an output terminal fixed to said one side wall of said case, and connected as the post-stage to a plurality of said band-stop filters,
wherein at least one said band-stop filter comprises
    a resonator, and
    an active circuit which is coupled to said resonator, and becomes a negative resistance in an operation band of the band-stop filter.

2. A filter apparatus in accordance with claim 1, wherein said resonator includes a dielectric coaxial resonator.

3. A filter apparatus wherein a desired frequency band is located in a pass band thereof and undesirable frequency bands are located in attenuation bands thereof, comprising
    an input terminal,
    a first band-pass filter, an input end of which is connected to said input terminal, and which is for transmitting a band containing said pass band,
    a non-reversible circuit element, a first terminal of which is connected to an output end of said first band-pass filter,
    a plurality of second band-pass filters, input ends of which are connected in common to a second terminal of said non-reversible circuit element which is the output side when said first terminal is set as the input side, and pass bands of which are located in said attenuation bands, and
    an output terminal which is connected to a third terminal of said non-reversible circuit element which is the output side when said second terminal is set as the input side,
wherein at least one said second band-pass filter comprises
    a resonator, and
    an active circuit which is coupled to said resonator, and becomes a negative resistance in an operation band of the second band-pass filter.

4. A filter apparatus in accordance with claim 3, wherein said resonator includes a dielectric coaxial resonator.

5. A filter apparatus in accordance with claim 3, wherein an output end of said second band-pass filter is put in no-load state.

6. A filter apparatus in accordance with claim 3, wherein said second band-pass filter includes a plurality of said resonators, and said active circuit is coupled to a last-stage resonator of said band-pass filter.

* * * * *